(12) United States Patent
Matsubara et al.

(10) Patent No.: US 10,732,347 B2
(45) Date of Patent: Aug. 4, 2020

(54) LIQUID CRYSTAL DISPLAY DEVICE HAVING A JOINT PORTION OF A WIRING SUBSTRATE EXTENDING FROM AN INSIDE TO AN OUTSIDE OF THE CASE

(71) Applicant: Japan Display Inc., Tokyo (JP)

(72) Inventors: Kosuke Matsubara, Tokyo (JP); Ken Sugiyama, Tokyo (JP); Kazunari Nishita, Tokyo (JP); Koji Hiramoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 31 days.

(21) Appl. No.: 15/961,034

(22) Filed: Apr. 24, 2018

(65) Prior Publication Data

US 2018/0306968 A1   Oct. 25, 2018

(30) Foreign Application Priority Data

Apr. 25, 2017   (JP) ................................ 2017-086614
Apr. 13, 2018   (JP) ................................ 2018-077772

(51) Int. Cl.
*F21V 8/00* (2006.01)
*G02F 1/1345* (2006.01)
(Continued)

(52) U.S. Cl.
CPC ........... *G02B 6/0083* (2013.01); *G02B 6/009* (2013.01); *G02B 6/0088* (2013.01); *G02F 1/13452* (2013.01); *G02F 1/133308* (2013.01); *H05K 1/181* (2013.01); *G02F 2001/133314* (2013.01); *H05K 1/147* (2013.01); *H05K 1/189* (2013.01); *H05K 2201/049* (2013.01); *H05K 2201/056* (2013.01); *H05K 2201/10106* (2013.01);
(Continued)

(58) Field of Classification Search
CPC combination set(s) only.
See application file for complete search history.

(56) References Cited

U.S. PATENT DOCUMENTS

2010/0060816 A1* 3/2010 Fukai ................ G02F 1/133615
349/58
2014/0362327 A1* 12/2014 Ohkubo ............ G02F 1/133308
349/58
(Continued)

FOREIGN PATENT DOCUMENTS

JP   2015-079579   4/2015
JP   2018-014315   1/2018
(Continued)

*Primary Examiner* — Lauren Nguyen
(74) *Attorney, Agent, or Firm* — K&L Gates LLP

(57) ABSTRACT

According to one embodiment, a liquid crystal display device includes a liquid crystal panel and a backlight device. The backlight device includes a case with a bottom plate and a side plate, a light guide on the bottom plate, and a light source device. The light source device includes a wiring substrate and a light-emitting element on the wiring substrate. The wiring substrate includes a mounting portion on which the light-emitting element is mounted, a connection wiring portion on a back surface side of the bottom plate, and a joint portion which joints the mounting portion and the connection wiring portion together. The joint portion extends from an inside to an outside of the case through a gap between the side plate of the case and the liquid crystal panel.

15 Claims, 10 Drawing Sheets

(51) Int. Cl.
H05K 1/18 (2006.01)
G02F 1/1333 (2006.01)
H05K 1/14 (2006.01)

(52) U.S. Cl.
CPC .............. *H05K 2201/10136* (2013.01); *H05K 2201/10674* (2013.01)

(56) References Cited

U.S. PATENT DOCUMENTS

| | | | |
|---|---|---|---|
| 2016/0262264 A1* | 9/2016 | Kim | ................ H05K 1/0281 |
| 2018/0011241 A1 | 1/2018 | Sugiyama | |
| 2018/0031751 A1 | 2/2018 | Sugiyama | |
| 2018/0031918 A1 | 2/2018 | Sugiyama et al. | |

FOREIGN PATENT DOCUMENTS

| | | |
|---|---|---|
| JP | 2018-026324 | 2/2018 |
| JP | 2018-026531 | 2/2018 |

\* cited by examiner

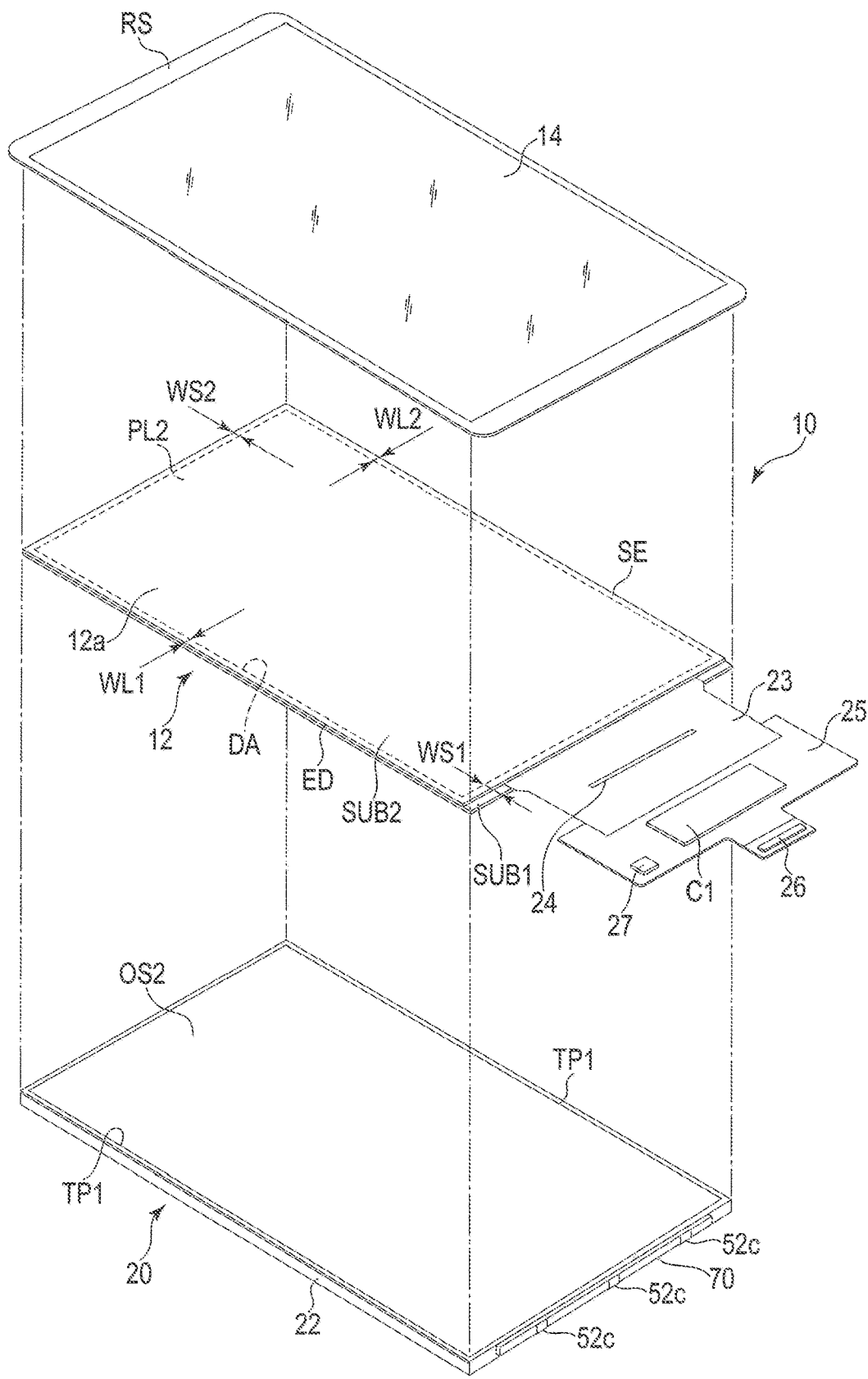
F I G. 4

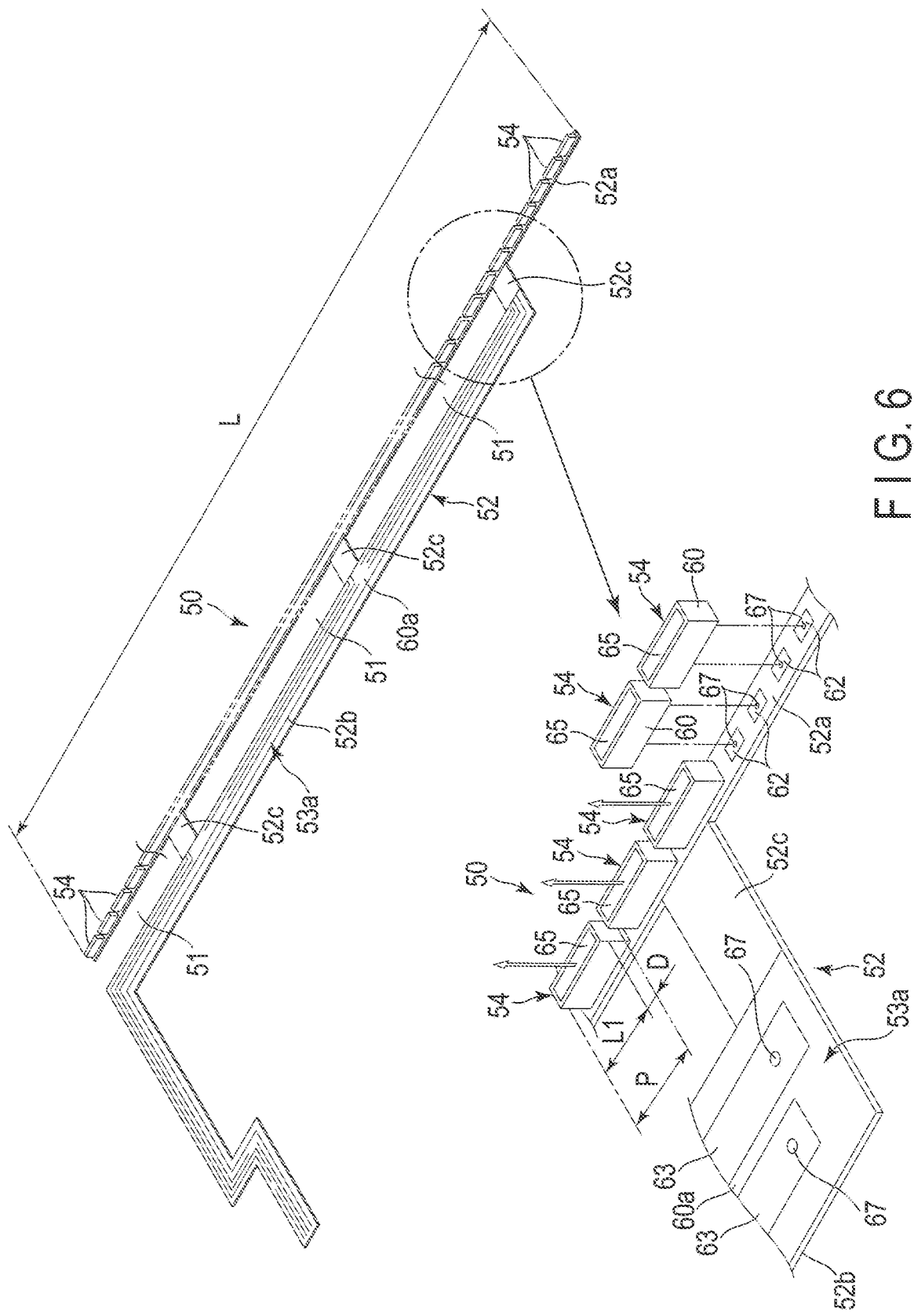
F I G. 6

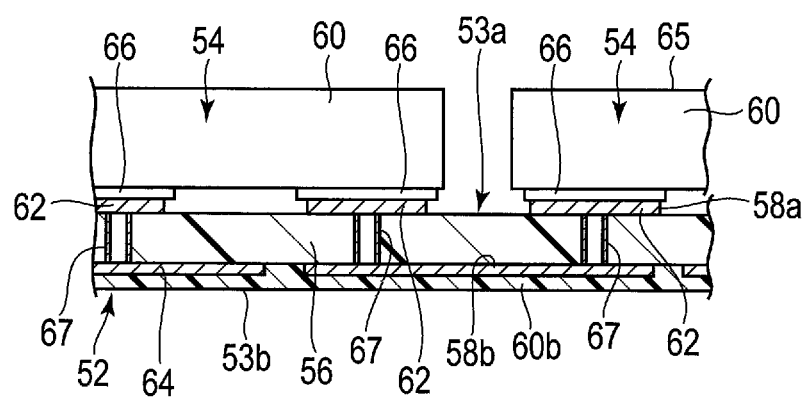
F I G. 7

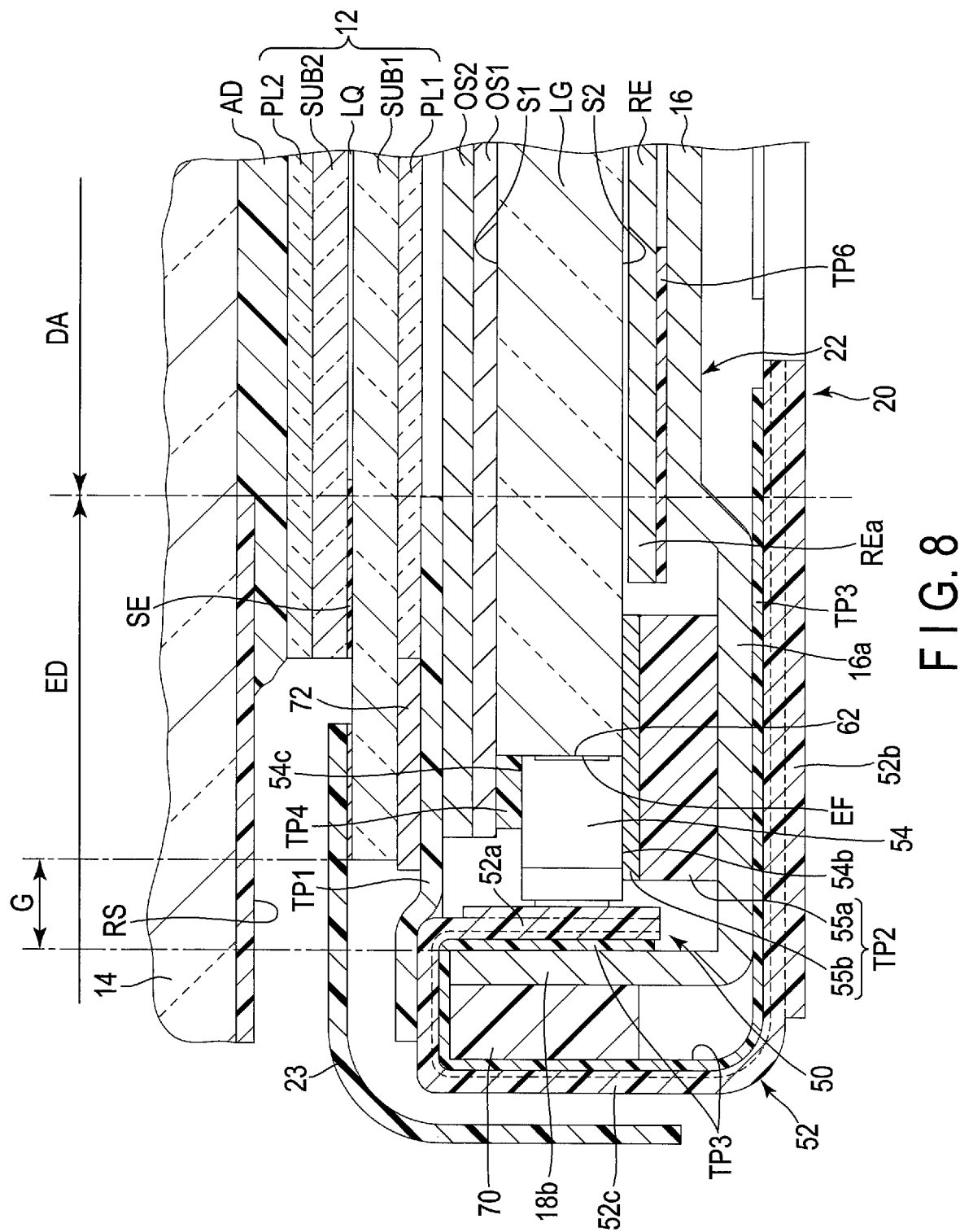
F I G. 8

LIQUID CRYSTAL DISPLAY DEVICE HAVING A JOINT PORTION OF A WIRING SUBSTRATE EXTENDING FROM AN INSIDE TO AN OUTSIDE OF THE CASE

CROSS-REFERENCE TO RELATED APPLICATIONS

This application is based upon and claims the benefit of priority from Japanese Patent Applications No. 2017-086614, filed Apr. 25, 2017; and No. 2018-077772, filed Apr. 13, 2018, the entire contents of all of which are incorporated herein by reference.

FIELD

Embodiments described herein relate generally to a liquid crystal display device.

BACKGROUND

In recent years, liquid crystal display devices are widely used as a display device of smartphones, tablet computers, vehicle-navigation systems, etc. In general, a liquid crystal display device comprises a liquid crystal display panel and a backlight unit overlaid on the rear surface of the liquid crystal display panel to illuminates the liquid crystal panel. The backlight unit includes a reflective layer, a light guide, an optical sheet, a light source unit, a case (bezel) in which these members are accommodated, etc. The light source unit includes a wiring substrate and a plurality of light sources, for example, light-emitting diodes (LEDs) mounted on the wiring substrate.

The wiring substrate of the light source unit is bent to a back side of the case and is electrically connected to a relay printed circuit board. Here, in some cases, the wiring substrate is electrically and mechanically jointed to the relay printed circuit board using solder. However, when jointed with solder, the soldered portion forms relatively tall solder bumps. These solder bumps can be an obstacle in thinning the back light device and the liquid crystal device.

SUMMARY

The present application generally relates to a liquid crystal display device.

According to one embodiment, a liquid crystal display device includes a liquid crystal panel and a backlight device. The backlight device includes a case with a bottom plate and a side plate, a light guide on the bottom plate, and a light source device. The light source device includes a wiring substrate and a light-emitting element on the wiring substrate. The wiring substrate includes a mounting portion on which the light-emitting element is mounted, a connection wiring portion on a back surface side of the bottom plate, and a joint portion which joints the mounting portion and the connection wiring portion together. The joint portion extends from an inside to an outside of the case through a gap between the side plate of the case and the liquid crystal panel.

BRIEF DESCRIPTION OF THE DRAWINGS

FIG. 4 is an exploded perspective view of the liquid crystal display device.

FIG. 6 is a perspective view showing a light source unit of the backlight unit.

FIG. 7 is a cross section of a part of a wiring substrate of the light source unit.

FIG. 8 is a perspective view showing a light source side of the liquid crystal display device exploded along line A-A of FIG. 3.

DETAILED DESCRIPTION

Various embodiments will be described hereinafter with reference to the accompanying drawings. In general, according to one embodiment, a liquid crystal display device comprises a liquid crystal panel comprising a first substrate, a second substrate opposed to the first substrate, and a liquid crystal layer between the first substrate and the second substrate; and a backlight device opposed to the first substrate. The backlight device comprises a case comprising a bottom plate and a side plate standing along a side edge of the bottom plate; a light guide on the bottom plate, comprising an emission surface and an incident surface extending to cross the emission surface; and a light source device which illuminate light to enter the incident surface of the light guide. The light source device comprises a wiring substrate including a plurality of wiring lines and a light-emitting element on the wiring substrate, the light emitting element comprising a light-emitting surface opposing the incident surface of the light guide and a mounting surface mounted on the wiring substrate. The wiring substrate comprises a mounting portion on which the light-emitting element is mounted, which opposes the incident surface with interposing the light emitting element therebetween, a connection wiring portion on a back surface side of the bottom plate, and a joint portion which joints the mounting portion and the connection wiring portion together, integrated as one body. The joint portion extends from an inside to an outside of the case through a gap between the side plate of the case and the liquid crystal panel.

Note that the disclosure is presented for the sake of exemplification, and any modification or variation conceived within the scope and spirit of the embodiments by a person having ordinary skill in the art is naturally encompassed in the scope of embodiment of the present application. Moreover, since a drawing describes more clearly, it may be typically expressed about the width of each part, thickness, form, etc., compared with an actual mode, but is an example to the last and does not limit the interpretation of the present invention. Besides, in the specification and drawings, the same elements as those described in connection with preceding drawings are denoted by like reference signs, and a detailed description thereof is omitted unless otherwise necessary.

Embodiment

Figure 1:
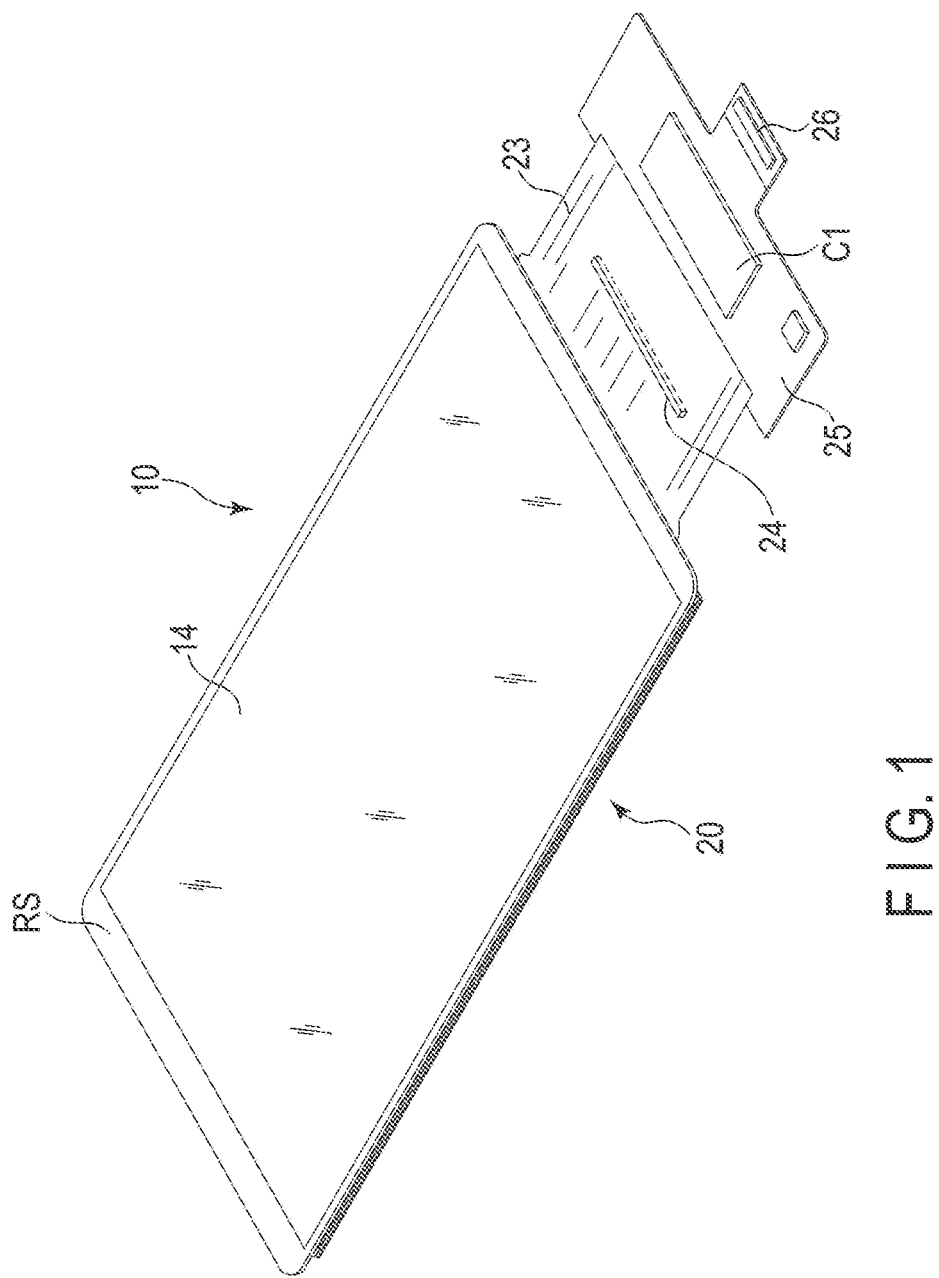
FIG. 1 is a perspective view showing a display surface side of a liquid crystal display device of an embodiment.
Figure 2:
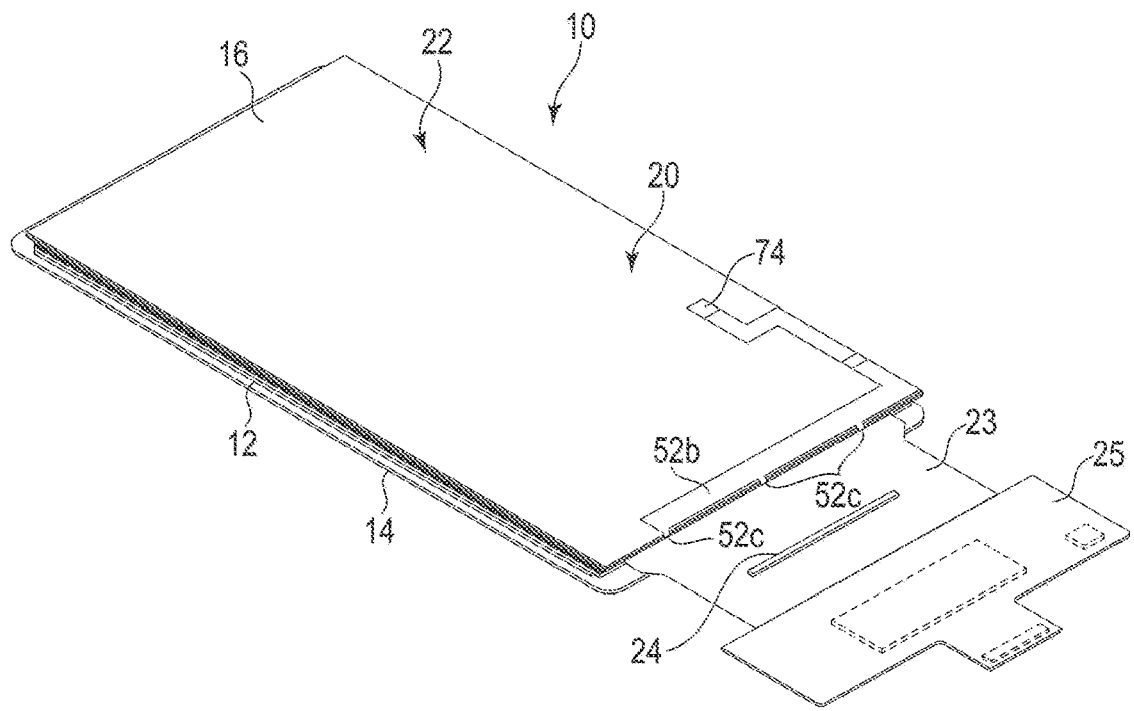
FIG. 2 is a perspective view which shows the liquid crystal display device from a rear surface side.
Figure 3:
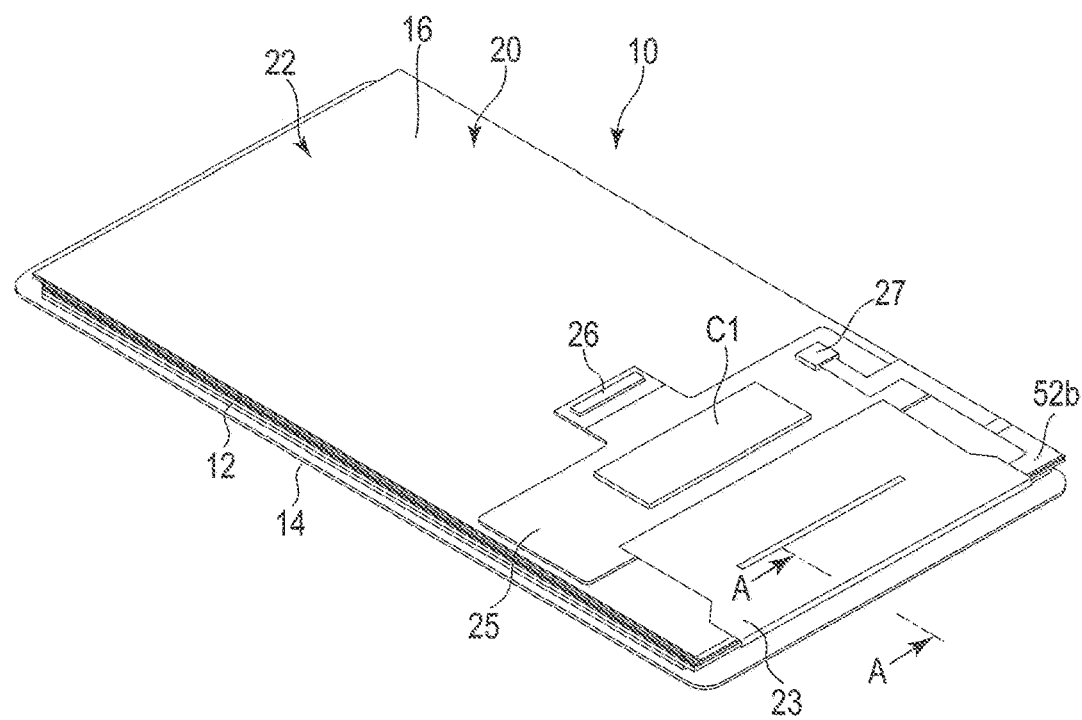
FIG. 3 is a perspective view showing the back surface side of the liquid crystal display device in the state where a main FPC is folded back and fixed.

FIGS. 1 and 2 are perspective views showing the display surface and back side of a liquid crystal display according to an embodiment, respectively. FIG. 3 is a perspective view showing the back side of the liquid crystal display in the state where a main FPC in which the driver IC is mounted is folded on the back side, and FIG. 4 is an exploded perspective view of the liquid crystal display.

The liquid crystal display 10 can be built in to be used in various kinds of electronic devices, for example, such as a smart phone, a tablet device, a cellular phone, notebook type PC, a handheld game machine, an electronic dictionary, a television device, and a car-navigation system.

As shown in FIGS. 1, 2 and 4, the liquid crystal display 10 comprises a liquid crystal panel 12 of an active-matrix shaped plate, a transparent cover panel 14 stacked on a display surface 12a, which is one flat surface of the liquid crystal panel 12 and covering the entire display surface 12a, and a backlight unit 20 as a backlight device, disposed to oppose the back surface, which is the other side of the liquid crystal panel 12.

The liquid crystal panel 12 comprises a rectangular plate-shaped first substrate SUB, a rectangular plate-shaped second substrate SUB2 disposed to oppose the first substrate SUB1, and a liquid crystal layer LQ held between the first substrate SUB1 and the second substrate SUB2. A peripheral portion of the second substrate SUB2 is adhered to the first substrate SUB1 with a sealing material SE. A polarizer PL2 is attached to a surface of the second substrate SUB2, thus forming the display surface 12a of the liquid crystal panel 12. A polarizer PL1 is attached to a surface of the second substrate SUB2 (a back surface of the liquid crystal panel 12).

In the liquid crystal panel 12, a rectangular display area (active area) DA is provided in a region located on an inner side of the sealing material in plan view (, which is a state where the liquid crystal panel is viewed from a normal direction of the display surface of the liquid crystal panel, to be referred to similarly hereinafter), to display images thereon. A rectangular frame area ED is provided around the display area DA. The liquid crystal panel 12 is a transmissive liquid crystal panel comprising a transmissive display function of displaying images by selectively transmitting or modulating the light from the backlight unit 20 to the display area DA. The liquid crystal panel 12 may have a structure provided for the lateral electric field mode which mainly utilizes a lateral electric field along a surface of the substrate, or a structure provided for the vertical electric field mode which mainly utilizes a vertical electric field crossing the main surface of the substrate.

In the example illustrated, a flexible printed circuit board FPC (main FPC) 23 is joined to a short side end of the first substrate SUB1 and extends from the liquid crystal panel 12 outward. As a signal supply source which supplies a signal required to drive the liquid crystal panel 12 to the main FPC 23, semiconductor devices of the driver IC24 and the like are mounted (the structure in which the driver IC is mounted on the FPC may be referred to as a chip-on flexible printed circuit called (COF)). A sub-FPC 25 is joined to an extending end of the main FPC 23. On the sub-FPC 25, a capacitor C1, connectors 26 and 27 and the like are mounted. As shown in FIG. 3, the main FPC 23 and the sub-FPC 25 are folded back along the short-side end edge of the first substrate SUB1, and disposed on a bottom plate of the back light unit 20. As will be described later, the main FPC 23 and the sub-FPC 25 are adhered to a bottom plate of the backlight unit 20 with an adhesive member such as a double-sided tape.

As shown in FIGS. 1 and 4, the cover panel 14 is formed, for example, into a rectangular plate shape from a glass plate or an acrylic transparent resin. A frame-shaped light-shielding layer RS is formed on a lower surface (a back surface, a surface on a liquid crystal panel side) of the cover panel 14. In the cover panel 14, a region other than the region which opposes the display area DA of the liquid crystal panel 12 is shielded by the light-shielding layer RS. The light-shielding layer RS may be formed on the upper surface (outer surface) of the cover panel 14. Note that the cover panel 14 may be omitted according to the use status of the liquid crystal display device 10.

The back light unit 20 comprises the flat rectangular case 22, an optical member and a light source unit 50, arranged in the case 22. The backlight unit 20 is attached to the back surface of the liquid crystal panel 12, which is, for example, the polarizer PL1 with a frame-shaped adhesive member, for example, a double-sided tape TP1.

As shown in FIG. 4, the non-display area ED of the liquid crystal panel 12 comprises sides having the same or substantially the same width. More specifically, widths WL1 and WL2 of the non-display area ED, which correspond to a pair of long sides of the display area DA, are equal to each other (WL1=WL2). Here, the widths WL1 and WL2 specifically indicates the dimension taken from the boundary between the display area DA and the non-display area ED to an outer edge of the first substrate SUB1 (and the second substrate SUB2) in the long sides of the display area DA. Moreover, of a pair of short sides of the display area DA, a width of the non-display area ED on a side where the flexible printed circuit substrate 23 is provided (, which is also referred to as a mounting side, hereinafter) is defined as WS1 and a width of the non-display area ED on a short side opposite thereto is defined as WS2, it is preferable to satisfy that WS2≤WS1 and WS1/WS2≤2.0, more preferably, WS1/WS2≤1.5, and further preferably, WS1/WS2≤1.0, when adopted. Here, the width WS1 of the non-display indicates the dimension taken from the boundary between the display area DA and the non-display area ED to the outer edge of the second substrate SUB2 in the short sides on the mounting side of the display area DA. The width WS2 of the indicates the dimension from the boundary between the display area DA and the non-display area ED to the outer edge of the first substrate SUB1 (and the second substrate SUB2) in the short side opposite to the mounting side of the display side.

Moreover, in any of these structures, it is preferable to satisfy that WL1=WL2<1.5 mm and WS2<1.5 mm, and more preferably, WL1=WL2<1.0 mm and WS2<1.0 mm. Furthermore, in any of these structures, it is possible to adopt that WL1=WL2=WS2.

With the above-described structures adopted, this embodiment can achieve such a structures that the width WS1 of the mounting side of the liquid crystal panel 12 can be remarkably narrowed more than the conventional technique, i.e., the width WS1 of the non-display area on the mounting side is substantially equal to that of the other regions of the non-display area ED.

Next, the backlight unit 20 will be described in more detail. In particular, the structure of the light-source side portion of the backlight unit will be described in more detail.

Figure 5:
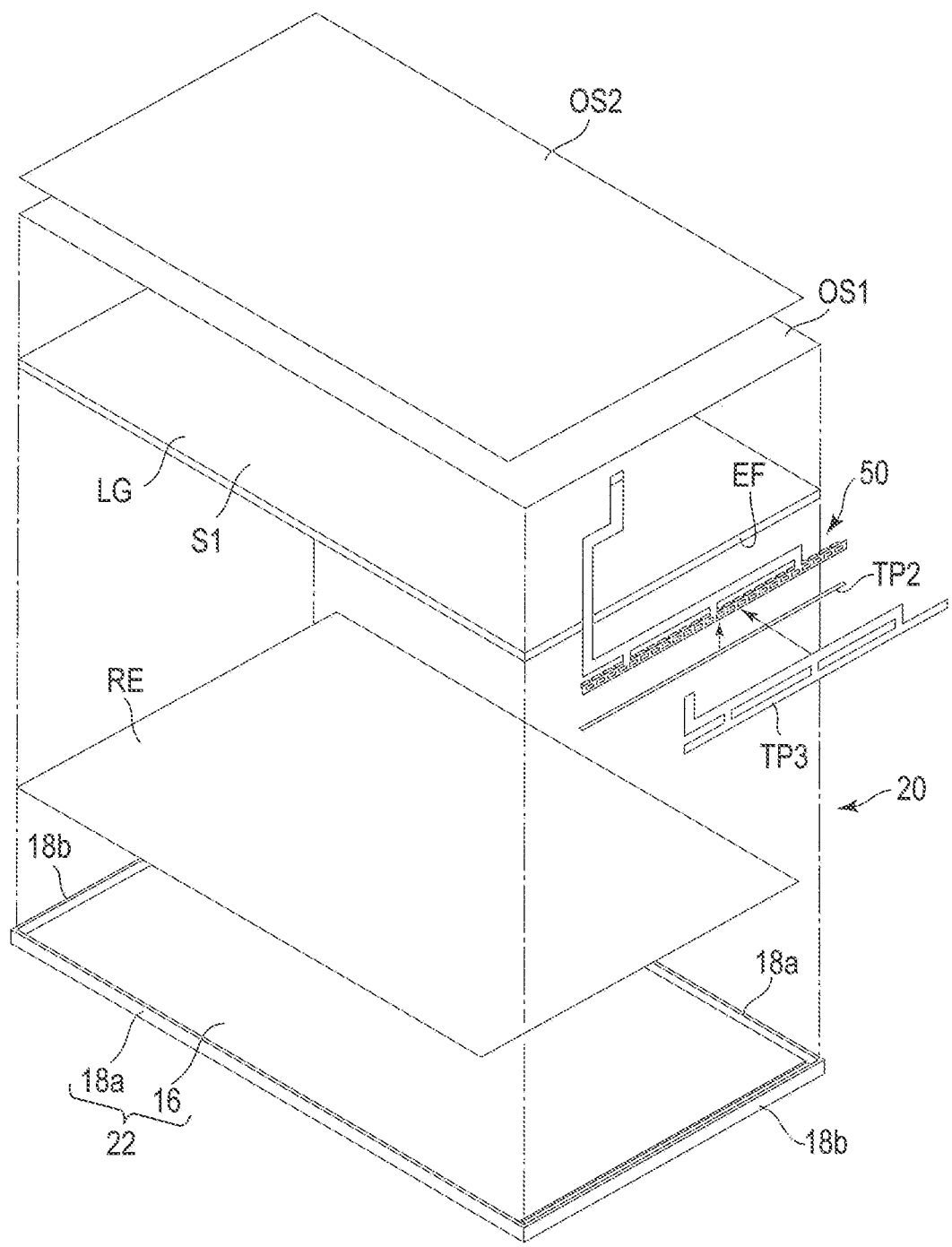
FIG. 5 is an exploded perspective view of a backlight unit of the liquid crystal display device.

FIG. 5 is an exploded perspective view of the backlight unit 20, and FIG. 6 is a perspective view of the light source unit, including a partially enlarged perspective view. FIG. 7 is a cross section of a wiring substrate. FIG. 8 is a cross section of the light source unit-side of the liquid crystal display, taken along line A-A of FIG. 3.

As shown in FIG. 5, the backlight unit 20 comprises a flat rectangular-shaped case (bezel) 22, a plurality of optical members arranged in the case 22, and the light source unit 50 which supplies light entering the optical members.

The case 22 is formed, for example, by subjecting a 0.1 mm-thick stainless plate member to bending process, press molding or the like, into a flat rectangle lid-shape (or a box shape with a top being open). The case 22 comprises a rectangular bottom plate 16, a pair of long-side plates 18a, and a pair of short-side plates 18b, which are built to stand from the respective side edges of the bottom plate 16. The long-side plates 18a are built to stand substantially perpendicular to the bottom plate 16, and extend over the full length of the long sides of the bottom plate 16. The short-side plates 18b are built to stand substantially perpendicular to the bottom plate 16 to the bottom plate 16, and extend over the full length of the short sides of the bottom plate 16. The height of these side plates 18a and 18b from the bottom 16 plate is, for example, about 1 mm.

As shown in FIGS. 5 and 8, in this embodiment, the end portion of the bottom plates 16, which opposes the light source unit 50 is formed a stepped portion (convex portion) 16a one step lower than the other portions. The stepped portion 16a slightly projects outwards, that is, toward a direction separating from the light source unit 50 accommodated in the case 22.

The backlight unit 20 comprises, as an optical member, a first reflective sheet RE, a light guide LG, and a plurality of, for example, a first optical sheet OS1 and a second optical sheet OS2, which have rectangular shapes in plan view. According to this embodiment, light-transmissive diffusion sheet and prism sheet, formed from, for example, a synthetic resin such as polyethylene terephthalate are used as the first optical sheet OS1 and the second optical sheet OS2. The number of optical sheets is not limited to two, but three or more optical sheets may be used.

The reflective sheet RE is formed to have outer dimensions substantially equal to the inner dimensions of the bottom plate 16 of the case 22. The reflective sheet RE is provided to be laid on the bottom plate 16 to covers substantially the entire flat section of the bottom plate 16. As shown in FIG. 8, the end REa on a light source side of the reflective sheet RE extends to the light source side over the display area DA of the liquid crystal panel 12, and is located on a front side with respect to the incident surface EF of the light guide LG A portion of the reflective sheets RE including the end REa is attached to the bottom plate 16 with a double-stick tape TP6.

As shown in FIGS. 5 and 8, the rectangular light guide LG comprises a first main surface S1 serving as an emission surface, a second main surface S2 opposing the first main surface S1, a pair of long-side surfaces and a pair of short-side surfaces. In this embodiment, one side surface on a short side of the light guide LG is an incident surface EF. The light guide LG has a thickness of about 0.23 mm to 0.32 mm. Further, the light guide LG is formed from, for example, a resin such as polycarbonate, an acrylic or silicon resin.

The light guide LG is formed to have an outer dimension (length, width) slightly less than the inner diameter of the case 22, but slightly greater than the outer dimension of the display area DA of the liquid crystal panel 12 in plan view. The light guide LG is accommodated in the case 22 in such a state that a second main surface S2 side thereof opposes the reflective sheet RE. Thus, the first main surface (emission surface) S1 of the light guide LG is located substantially parallel to the bottom plate 16 of the case 22, and the incident surface EF is located almost perpendicularly to the bottom plate 16.

As shown in FIG. 8, the incident surface-side end portion of the light guide LG extends towards the light source side over the display area DA of the liquid crystal panel 12. Further, the incident surface-side end portion of the light guide LG extends towards the light source side over the end REa of the reflective sheet RE. Thus, the incident surface EF of the light guide LG is placed to oppose the short-side side plate 18b of the case 22 with a slight gap therebetween. It is preferable that the gap should be 1.0 mm or less, more preferably 0.8 mm or less, and particularly preferably 0.5 mm or less. Conventionally, the gap is about 3.0 mm to 4.0 mm. As compared to this, the gap in this embodiment is remarkably narrow, and the light source unit 50 is provided in such a narrow gap.

As shown in FIGS. 5 and 6, the light source unit 50 comprises, for example, a wiring substrate 52 formed of a flexible printed circuit board (FPC), and a plurality of light sources mounted and arranged on the wiring substrate 52. The light sources are, for example, light-emitting elements such as light-emitting diodes (LEDs) 54. The wiring substrate 52 comprises a slender belt-shaped mounting portion (mounting region) 52a in which the LEDs 54 are mounted, a slender belt-shaped connection wiring portion 52b disposed on the back side of the case 22 and a plurality of bridge portions (joint portions, joint regions) 52c which couple the mounting portion 52a and the connection wiring portion 52b to each other, as an integral body. The connection wiring portion 52b is aligned parallel with the mounting portion 52a with a gap therebetween. For example, three of the bridge portions 52c are formed, and the bridge portions 52c are arranged in a longitudinal direction of the mounting portion 52a at predetermined intervals. This arrangement can be described as openings 51 being formed between the three bridge portions 52c, respectively. Thus, in this embodiment, the wiring substrate 52 is formed to include the mounting portion 52a, the connection wiring portion 52b and the bridge portion 52c, integrated as one body. More specifically, the embodiment adopts such a structure that a plurality of openings 51 are formed in the wiring substrate 52 so that one side of each opening 51 is used by the mounting portion 52a and the other side used by the connection wiring portion 52b, and a bridge portion 52c is built over these portions.

As shown in FIGS. 6 and 7, the wiring substrate 52 comprises a first surface (front surface) 53a and a second surface (back surface) 53b on an opposite side thereto. The wiring substrate 52 comprises a base layer (insulating layer) 56 formed from an insulating material such as polyimide, a first conductive layer 58a of, for example, a copper foil formed on one surface of the base layer 56, a cover layer (cover insulating layer) 60a stacked on the first conductive layer 58a, a second conductive layer 58b of, for example, a copper foil formed on the other surface of the base layer 56, and a cover layer (cover insulating layer) 60b formed to be stacked on the second conductive layers 58b. The first conductive layer 58a, when patterned, forms a plurality of contact pads 62 and the like, and a plurality of wiring lines. Similarly, the second conductive layer 58a, when patterned, forms a plurality of contact pads and wiring lines.

In this embodiment, a number of contact pads 62 are formed on the mounting portion 52a in the front surface 53a of the wiring substrate 52. The contact pads 62 are arranged in the longitudinal direction of the mounting portion 52a at predetermined intervals. In the front surface 53a, a plurality of wiring lines 63 are formed partially in the connection wiring portion 52b and the bridge portions 52c. The wiring lines 63 extend continuously from one longitudinal end side of the connection wiring portion 52b to the other end side.

A number of wiring lines 64 are formed on the mounting portion 52a and the bridge portion 52c in the back surface 53b of the wiring substrate 52. The wiring lines 64 are electrically connected to the corresponding contact pads 62 and wiring lines 63 on the front surface 53a side, for example, via a plurality of plated through-holes 67.

Note that the arrangement and shape of each of the wiring pattern and connection pad pattern in the wiring substrate 52 are not limited to those of the embodiment described above, but can be changed as needed.

As shown in FIG. 6, a length L of the mounting portion 52a is substantially equal to that of the incident surface EF of the light guide LG. Each LED 54 comprises a substantially rectangular parallelepiped case (package) 60 formed of a resin, for example. The upper surface of the case 60 forms the light-emitting surface 65, and the bottom surface of the case 60, located on an opposite side to the light-emitting surface 65, forms a mount surface. On the bottom surface of the case 60, connection terminals 66 are provided (see FIG. 7). Note that each LED 54 is formed into substantially a rectangular parallelepiped shape, but the shape is not limited to this. More specifically, the LEDs 54 may comprise uneven side surfaces or may be formed into a curvy shape.

The LEDs 54 are each mounted so that the bottom surface thereof meets the front surface 53a of the mounting portion 52a, and thus the connection terminals 66 are electrically jointed respectively to the contact pads 62. The light-emitting surface 65 of each LED 54 is set substantially parallel to the wiring substrate 52, and each LED 54 emits light from the light-emitting surface 65 in a direction substantially perpendicular to the wiring substrate 52.

In this embodiment, the light source unit 50 contains plural LEDs 54 depending on the width of the display area DA. For instance, the number of the LEDs is about 2.5 to 3 times as compared to the conventional structure with a display area having the same area. These LEDs 54 are arranged on the mounting portion 52a in one row from one longitudinal end of the mounting portion 52a to the other end.

In this embodiment, an arrangement pitch P of the LEDs 54 is set to about 1.1 to 1.5 times of the length L1 of each LED 54 in the arrangement direction, and an interval D between each adjacent pair of the LEDs 54 is set to about 10% to 50% of the length L1 of each LED 54. In this embodiment, the LEDs 54 are arranged at intervals D less than those of the conventional techniques, and thus the region where non-uniformity in luminance, which may occur between adjacent point light sources, can be narrowed.

The number of the LEDs 54 may be increased or decreased as needed. When LEDs having a length greater than L1 are used, the loading number of LEDs may be decreased.

Figure 9:
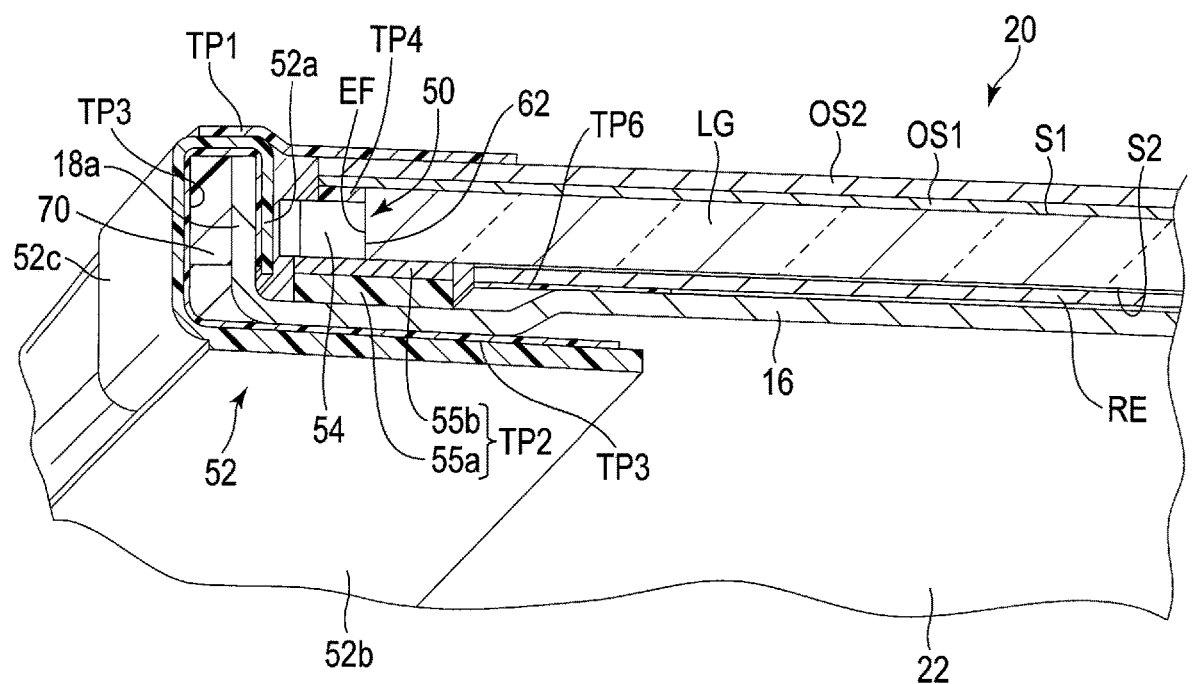
FIG. 9 is a perspective view of the back light unit including a section corresponding to FIG. 9.

FIG. 9 is an exploded perspective view showing a light source-side portion of the back light unit 20. As shown in FIGS. 8 and 9, the light source unit 50 thus formed is partially located in the case 22 and partially in an outer surface side of the case 22. The mounting portion 52a and the LEDs 54 on the wiring substrate 52 are disposed between the incident surface EF of the light guide LG and the side plate 18b of the case 22. The light-emitting surfaces 62 of the LEDs 54 oppose or abut against the incident surface ER The mounting portion 52a of the wiring substrate 52 is attached to an inner surface of the side plate 18b with, for example, an adhesive member such as a double-sided tape TP3. The mounting portion 52a opposes the incident surface EF via the LEDs 54 interposed therebetween.

A belt-shaped fixing tape TP2 is adhered on the side surface of each of the LEDs 54 (in the figure, the side surfaces 54b opposing to a bottom plate 16 side of the case 22) and the second main surface S2 of the light guide LG. The LEDs 54 are aligned with respect to the light guide LG and fixed there with the fixing tape TP2. The fixing tape TP2 is attached on the LEDs 54 by about half a region thereof along its width direction, and the remaining half is attached on the light guide LG The fixing tape TP2 comprises a belt-like base material 55a formed from, for example, polyethylene terephthalate (PET) and an adhesives layer 55b or a sticky layer, formed on at least one of the surfaces of the base material 55a. Further, at least one of the base material 55a and the adhesives layer 55b is colored in black with, for example, fine black particles, black ink or the like. Thus, the fixing tape TP2 forms a light-shielding member with light-shielding properties.

Further, the fixing tape TP2 is disposed along the reflective sheet RE in a plane direction of the light guide LG That is, the fixing tape TP2 extends to near the light source-side end REa of the reflective sheet RE and is aligned with the reflective sheet RE along its plane direction with a slight gap therebetween. Thus, the fixing tape TP2 and the reflective sheet RE are not stacked one another with relation to each other.

According to this embodiment, the fixing tape TP2 is formed thicker than the reflective sheet RE, and is placed in the stepped portion 16a of the bottom plate 16. The fixing tape TP2 is provided to abut the inner surface of the bottom plate 16. The fixing tape TP2 is not limited to one continuous tape, but may be of a plurality of divided fixing tapes.

As shown in FIGS. 8 and 9, on the mounting side, a gap G is defined between the side plate 18b of the case 22 and the end edge of the first substrate SUB 1. The bridge portions 52c of wiring substrate 52 extend form the inside to the outside of the case 22 through the gap G Each bridge portion 52c is bent outward along an upper end edge of the side plate 18b to extend along the outer surface of the side plate 18b. More specifically, each bridge portion 52c extends from the inside to the outside of the case 22 with being turned along the end edge of the side plate 18b. The connection wiring portion 52b is disposed on the back surface of the bottom plate 16 of the case 22. In this embodiment, a spacer 70 is interposed between each bridge portion 52c and the side plate 18b. The spacer 70 is formed into a belt-shape from a synthetic resin to extend over substantially the full length of the side plate 18b (see FIG. 4). Thus, the spacer 70 is disposed between the three bridge portions 52c and the side plate 18b. The spacer 70 is provided to adjust the longitudinal dimension of the backlight unit 20.

The double-sided tape TP3 described above is attached on the back surface 53b of the wiring substrate 52. In this embodiment, the double-sided tape TP3 is formed into substantially the same shape and dimensions to those of the wiring substrate 52 and attached on the entire back surface 53b (see FIG. 5). Thus, the bridge portions 52c are attached on the upper end edge of the side plate 18b and the outer surface of the spacer 70 with the double-sided tape TP3. Further, the connection wiring portion 52b is attached on the back surface (outer surface) of the bottom plate 16 of the case 22 with the double-sided tape TP3.

The double-sided tape TP3 is electrically insulative. Therefore, the double-sided tape TP3 does not only attach the wiring substrate 52 to the case 22 and the spacer 70, but also it ensures the electric insulation between the wiring substrate 52 and the case 22. Further, with the double-sided tape TP3 provided between the upper end edge (edge portion) of the side plate 18b and the wiring substrate 52, damage which may be caused by the edge portion to the wiring substrate 52 can be prevented to protect the wiring substrate 52.

As shown in FIG. 8, the wiring substrate 52 may be structured as well so that the wiring lines (conductive layer) are provided only on the back surface 53b side the bridge portions 52c (the structure without the first conductive layer and the cover layer). In this case, the thickness of the bridge portions 52c can be set thinner than that of the mounting portion 52a and the connection wiring portion 52b. Thus, it becomes possible to easily bend the bridge portion 52c, and thus to amount and arrange the wiring substrate 52. Moreover, in the wiring substrate 52 of this embodiment, the bridge portions 52c are bending portions. Here, the bending portions are the openings 51 except for the bridge portion 52c, and therefore the bend stress (elastic restorability) is remarkably low. As a result, it is only natural that the wiring substrate 52 can be easily bent, and also the bent state can be maintained in an excellent way.

As shown in FIGS. 8 and 9, a short-side end portion of a first optical sheet OS1 extends over the incident surface EF of the light guide LG to a position opposing the LEDs 54. In this embodiment, the light-shading tape TP4 is attached on the end portion of the first optical sheet OS1 to oppose the LEDs 54. The light source-side end of the second optical sheet OS2 projects from the display area DA towards the non-display area ED and is located to overlap the end portion of the first optical sheet OS1 and the light-shading tape TP4.

Thus, also in the non-display area ED, the first optical sheet OS1 and the second optical sheet OS2 of a prism sheet are stacked one on another to oppose the end portion of the light guide LG and the incident surface EF, the light-emitting surfaces 65 of the LEDs 54 and the end portion of the light-shading tape TP4. With this arrangement, of the unexpected leaking light, which may easily occur in a space close to this type of light-emitting portions, the light traveling towards the liquid crystal panel 12 passes through the first optical sheet OS1 and the second optical sheet OS2 as in the display area AD, thus making it possible to suppress the turbulence of the emitted light of the back light device, especially, in the end portion of the display area (the light-emitting side end).

As shown in FIGS. 4 and 9, the backlight unit 20 is adhered to the back surface of the liquid crystal panel 12 with the frame-shaped double-sided tape TP1. The double-sided tape TP1 is attached on the peripheral portion of the second optical sheet OS2. In the light source side, the double-sided tape TP1 is attached also on the bridge portions 52c of the wiring substrate 52 and the spacer 70. Further, on a liquid crystal panel 12 side, the double-sided tape TP1 is adhered to the peripheral portion of the polarizer PL1 and the peripheral portion of the first substrate SUB1 interposing a spacer 72 therebetween.

The bridge portions 52c oppose to the first substrate SUB 1 through the double-sided tape TP1. More detail, the bridge portions 52c oppose to the first substrate SUB1 via the double-sided tape TP1 and the spacer 72. The bridge portions 52c are partially covered with the double-sided tape TP1 and protected thereby. By providing the double-sided tape TP1 between the bridge portions 52c and the first substrate SUB1, the first substrate SUB1 and the like do not directly contact the bridge portions 52c, when the backlight unit 20 is attached to the liquid crystal panel 12. Thus, frequency in occurrence of inferior devices at the assembling can be lowered.

As shown in FIG. 3, the main FPC23 and the sub-FPC 25 extending from the liquid crystal panel 12 are folded back to the back surface side of the bottom surface 16 along the side plate 18b of the case 22. The main FPC23 and the sub-FPC 25 are attached on the bottom plate 16 with an adhesion member (not shown). As shown in FIGS. 2 and 3, the connection wiring portion 52b of the wiring substrate 52 includes an extending portion extending in the longitudinal direction of the case 22. A connector 74 provided in the end of the extending portion is connected to the connector 27 on the sub-FPC 25.

According to the liquid crystal display 10 configured as described above, the wiring substrate 52 of the light source unit 50 is a printed circuit board including the mounting portion 52a on which the LEDs 54 are mounted, the connection wiring portion 52b provided on the bottom plate of the case 22, and the joint portion (bridge portion) 52c which connects them as one body. With this structure, the switching between upper and lower wiring lines can be conducted in the wiring substrate 52, and the relay wiring substrate for switching the connection is no longer needed. Further, the mounting portion 52a and the connection wiring portion 52b need no longer be jointed to each other with solder or the like, and thus the solder joint portion (solder bump) can be removed. As a result, the portion corresponding to the height of the solder bump can be removed, thereby making it possible to slim down the backlight unit 20.

Thus, according to this embodiment, a thinner backlight device and the liquid crystal display device with narrowed frame can be provided.

Now, modifications of the liquid crystal display device will be described. Note that in the modifications described below, the same reference symbols are given to the same parts as those of the embodiment described above, and detailed described therefor will be omitted or simplified and items different from those of the first embodiment described above will be mainly explained in detail.

(First Modification)

Figure 10:
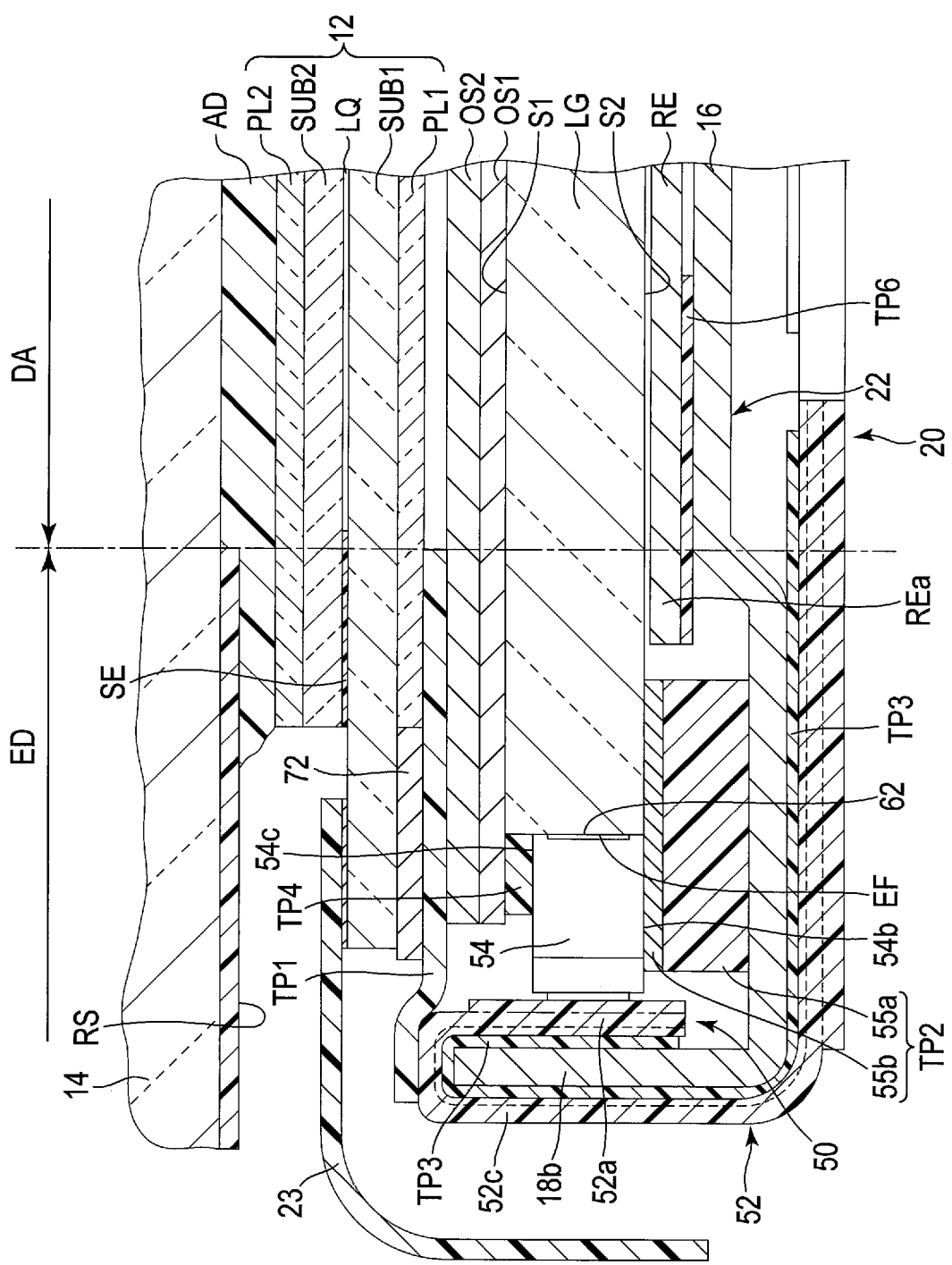
FIG. 10 is a cross-sectional view which shows a light source side of a liquid crystal display device of a first modified example.

FIG. 10 is a cross-section of the light source-side portion of a liquid crystal display device of a first modification. According to the first modification, the spacer 70 is omitted. In this case, the bridge portions 52c of the wiring substrate 52 are attached on the outer surface of the side plate 18b with the double-sided tape TP3. As described above, the bridge portions 52c are formed to be comparatively thin as a layer, and can be easily bent along the side plate 18b. Further, since the spacer 70 is omitted, the entire length of the backlight unit 20, and the other dimensions can be reduced.

(Second Modification)

Figure 11:
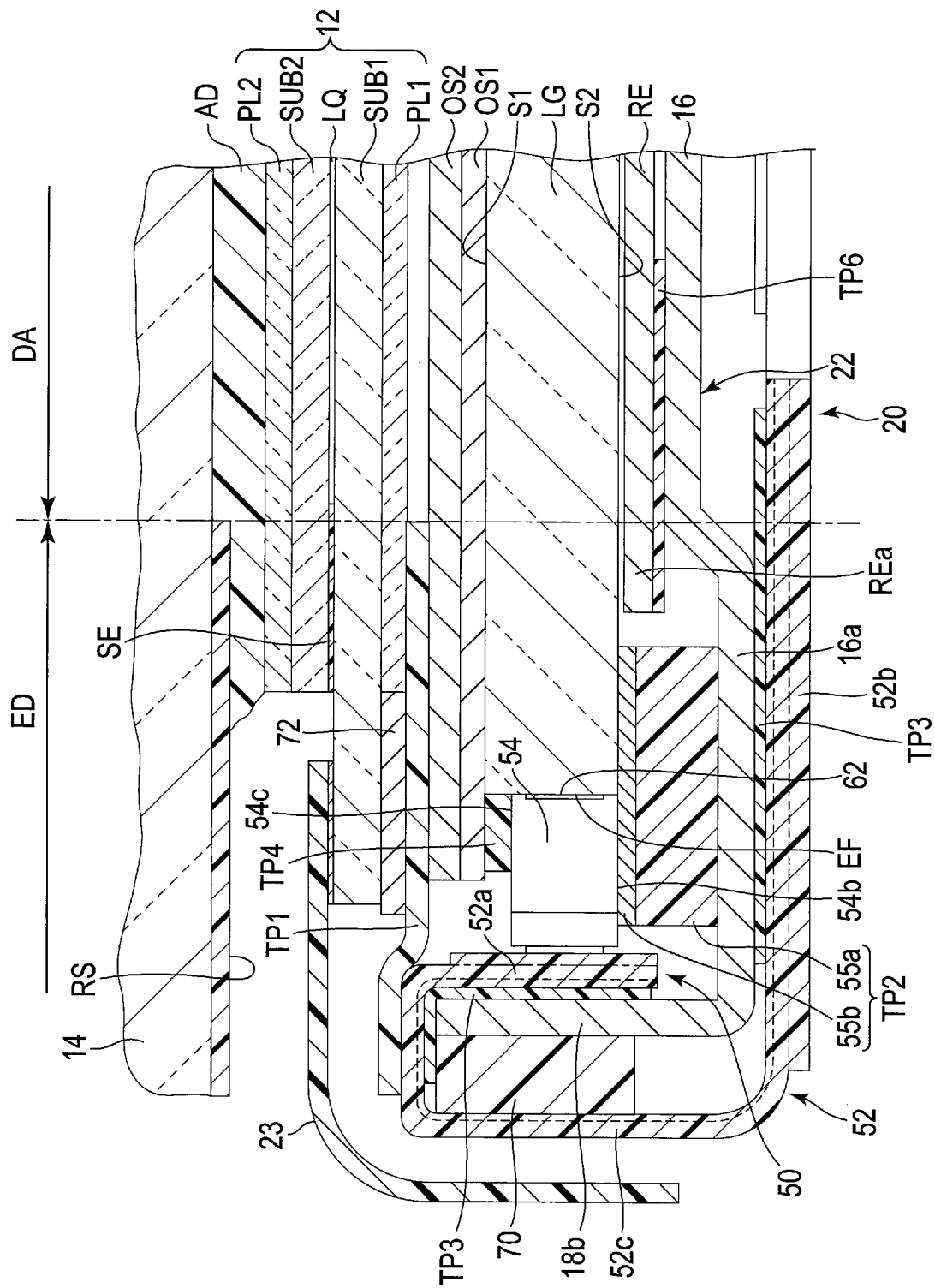
FIG. 11 is a cross-sectional view which shows a light source side of a liquid crystal display device of a second modified example.

FIG. 11 is a cross-section of the light source-side portion of a liquid crystal display device of a first modification. An adhesive member (double-sided tape TP3) to adhere the wiring substrate 52 may not be provided on the entire surface of the wiring substrate 52. According to the second modification, the double-sided tape TP3 is provided between the side plate 18 including the upper end edge portion thereof and the mounting portion 52a of the wiring substrate 52, and between the connection wiring portion 52b and the bottom plate 16. Here, the double-sided tape between the bridge portion 52c and the spacer 70 is omitted. Also such a structure as well, with the double-sided tape TP3, the electric insulation between the wiring substrate 52 and the case 22 can be ensured, and also the wiring substrate 52 can be protected against the edge portion of the side plate 18b.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

Note that all the structures which can be carried out by any modification and variation conceived within the scope and spirit of the invention by a person having ordinary skill in the art based on each structural elements described in the embodiments are naturally encompassed in the scope of invention of the present application. Further, regarding the present embodiments, any advantage and effect which would be obvious from the description of the specification or arbitrarily conceived by a skilled person are naturally considered achievable by the present invention.

The outer and inner shapes of the structure members of a liquid crystal panel and a backlight unit are not limited to rectangular, but one or both of the outer and inner shapes may be of some other forms such as polygonal, circular, elliptical or any combination of these in plan view. The liquid crystal panel and backlight unit are not limited to a flat shape, but they may be at least partially or entirely curved. The materials of the structural members are not limited to those listed in the examples, but may be selected from various options.

What is claimed is:

1. A liquid crystal display device comprising:
a liquid crystal panel comprising a first substrate, a second substrate opposed to the first substrate, and a liquid crystal layer between the first substrate and the second substrate; and
a backlight device opposed to the first substrate;
the backlight device comprising:
a case comprising a bottom plate and a side plate standing along a side edge of the bottom plate, the side edge being located laterally outside of the first substrate;
a light guide on the bottom plate, comprising an emission surface and an incident surface extending to cross the emission surface; and
a light source device which illuminates light to enter the incident surface of the light guide,
the light source device comprising a wiring substrate including a plurality of wiring lines and a light-emitting element on the wiring substrate, the light-emitting element comprising a light-emitting surface opposing the incident surface of the light guide and a mounting surface mounted on the wiring substrate, and
the wiring substrate comprising a mounting portion on which the light-emitting element is mounted, which opposes the incident surface with interposing the light-emitting element therebetween, a connection wiring portion on a back surface side of the bottom plate, and a joint portion which joints the mounting portion and the connection wiring portion together, integrated as one body,
the joint portion extending from an inside to an outside of the case through a gap between the side plate of the case and the first substrate of the liquid crystal panel.

2. The liquid crystal display device of claim 1, wherein the joint portion of the wiring substrate extends from the inside to the outside of the case with being turned along an end edge of the side plate.

3. The liquid crystal display device of claim 2, wherein the joint portion is curved along the end edge of the side plate and an outer surface of the side plate, and extends to the connection wiring portion.

4. The liquid crystal display device of claim 3, wherein the joint portion includes a plurality of bridge portions each connecting the mounting portion and the connection wiring portion to each other.

5. The liquid crystal display device of claim 1, further comprising: an adhesive member between the case and the wiring substrate.

6. The liquid crystal display device of claim 5, wherein the adhesive member includes a double-sided tape located between the side plate and the mounting portion and between an end edge of the side plate and the joint portion.

7. The liquid crystal display device of claim 6, wherein the adhesive member includes a double-sided tape located between the connection wiring portion and the bottom plate.

8. The liquid crystal display device of claim 2, further comprising: an adhesive member between the case and the wiring substrate.

9. The liquid crystal display device of claim 8, wherein the adhesive member includes a double-sided tape located between the side plate and the mounting portion and between the end edge of the side plate and the joint portion.

10. The liquid crystal display device of claim 9, wherein the adhesive member includes a double-sided tape located between the connection wiring portion and the bottom plate.

11. The liquid crystal display device of claim 1, further comprising: a spacer between the outer surface of the side plate and the joint portion.

12. The liquid crystal display device of claim 1, wherein the wiring substrate comprises an insulating layer, a first conductive layer and a second conductive layer provided respectively on a first surface and a second surface of the insulating layer, each forming a plurality of wiring lines, a first cover layer which covers the first conductive layer and a second cover layer which covers the second conductive layer.

13. The liquid crystal display device of claim 12, wherein a connection terminal on which the light-emitting element is mounted is formed from the first conductive layer in the mounting portion, a plurality of wiring lines are formed from the second conductive layer located on a side plate side in the joint portion, and a plurality of wiring lines are formed from the first conductive layer located on an opposite side to the bottom plate in the connection wiring portion.

14. The liquid crystal display device of claim 1, wherein the case is adhered to the liquid crystal panel via a double-sided tape, and the joint portion faces to the liquid crystal panel via the double-sided tape.

15. The liquid crystal display device of claim 1, wherein the liquid crystal panel comprises a spacer between the first substrate and the double-sided tape, and the joint portion faces to the spacer via the double-sided tape.

* * * * *